United States Patent [19]

Prudhon et al.

[11] 4,001,524

[45] Jan. 4, 1977

[54] APPARATUS FOR TRANSMITTING AND RECEIVING PULSES

[75] Inventors: Lucien Pierre Emile Prudhon, Soisy, Seine; Jean Pierre Georges Charil, Clamart, both of France

[73] Assignee: Association des Ouvriers en Instruments de Precision, Paris, France

[22] Filed: Oct. 21, 1974

[21] Appl. No.: 516,575

Related U.S. Application Data

[63] Continuation of Ser. No. 319,168, Dec. 28, 1972, abandoned.

[30] Foreign Application Priority Data

Jan. 4, 1972 France ............................ 72.00102
Dec. 8, 1972 France ............................ 72.43763

[52] U.S. Cl. ............................................ 179/170 T
[51] Int. Cl.[2] ............................................ H04B 1/58
[58] Field of Search .... 179/170 NC, 170 D, 170 T, 179/81 A, 3, 15 AA; 333/11; 330/30 R, 123, 124 R

[56] References Cited

UNITED STATES PATENTS

| | | | |
|---|---|---|---|
| 3,180,947 | 4/1965 | Haselton | 179/170 NC |
| 3,480,742 | 11/1969 | Gaunt | 179/170 NC |
| 3,586,881 | 6/1971 | Gaunt | 179/170 NC |

*Primary Examiner*—Kathleen Claffy
*Assistant Examiner*—Joseph A. Popek
*Attorney, Agent, or Firm*—Karl F. Ross; Herbert Dubno

[57] ABSTRACT

A duplexer coupling a subscriber line of a PCM telephone system to a modulation channel and a demodulation channel comprises a plurality of transistorized amplifier stages with input connections from the demodulation channel and output connections to the modulation channel. The modulation channel is decoupled from the demodulation channel by being connected, directly or through one such amplifier stage, to a neutral point of a resistance network inserted between the demodulation channel and a transistor connecting the latter channel to the subscriber line; the neutral point may be the junction of two resistors or the output of an operational amplifier having inverting and noninverting inputs connected to cophasally energized points of the resistance network. Each of the two channels includes a filter and an associated amplifier which may be combined into an active filter of the Tchebycheff type. In the quiescent state of the system the power supply to the active filters may be cut off.

23 Claims, 15 Drawing Figures

APPARATUS FOR TRANSMITTING AND RECEIVING PULSES

CROSS-REFERENCE TO RELATED APPLICATION

This application is a continuation of our application Ser. No. 319,168 filed Dec. 28, 1972 and now abandoned.

FIELD OF THE INVENTION

Our present invention relates to a telephone system of the PCM type having means for transmitting and receiving coded, amplitude-modulated signal pulses spaced apart in time.

BACKGROUND OF THE INVENTION

A conventional system used for this purpose comprises a transmitter/receiver assembly or duplexer connected, on the one hand, to telephone equipment such as a subscriber's instrument by means of a coupler and a telephone line and, on the other hand, to a similar assembly by means of a transmission link terminating in analog/digital and digital/analog converters.

In the transmitter section of such a duplexer the voice signal to be transmitted is sampled and reproduced in the form of amplitude-modulated pulses. These modulated pulses are then tansmitted to an analog/digital converter which encodes each of them into groups of *n* bits. These groups of bits are fed, by the transmission link, to a digital/analog converter in which the encoded pulses are decoded and transformed into pulses whose amplitude is a function of the value of the encloded pulses received. The pulses leaving this digital/analog converter are transmitted to the receiver section of another duplexing device where they are demodulated and filtered to reconstitute the emitted signal.

Thus, each of these devices includes a modulation channel with an outgoing amplifier and a demodulation channel with an incoming amplifier connected to a telephone instrument by a coupler.

The modulation channel comprises a low-frequency fixed-gain amplifier, a low-pass filter arranged to suppress frequencies higher than 4000 Hz, and a modulator, all connected in series. The amplified and filtered signal is transmitted to the modulator which is controlled by a sampling system common to a number of such devices. The output from the modulator is connected to the analog/digital converter either directly or through an omnibus multiplex link or bus bar common to this plurality of devices.

The demodulation channel receives the amplitude-modulated pulses either directly or through an omnibus multiplex link common to a number of devices associated with the digital/analog converter. This channel comprises a demodulator, an amplifier and a low-pass filter connected in series.

The demodulator selects the amplitude-modulated pulses and charges a capacitor during the time the demodulator is sampling. The capacitor integrates the pulses, which are transmitted to the amplifier and then to the filter which suppresses all frequencies higher than 4000 Hz.

The coupler, which is adjusted by a balancer, joins the two-wire circuit of the telephone instrument to the four-wire circuit necessary in order that each channel may have two wires and may be isolated from the other channel. It also serves as a switch from the transmitted and received signals. A signal transmitted by the telephone instrument is switched by the coupler into the modulation channel, which processes it with the object of transmitting it to the analog/digital converter. Conversely, a series of pulses supplied by the digital/analog converter and received by the demodulation channel is, after processing by the latter, transmitted to the coupler which switches it to the telephone instrument.

However, this known duplexer suffers from serious drawbacks. Firstly, the coupler is constituted by a differential transformer with multiple windings requiring a balancer. As a result, the device is expensive and heavy. Furthermore, owing to the need for a transformer, the device cannot be produced in the form of an integrated semiconductor circuit.

OBJECTS OF THE INVENTION

It is an object of the invention to remove or remedy these drawbacks.

It is a further object of our invention to provide a duplexer for the purpose hereinabove set forth which is less heavy, less bulky, more reliable and less sensitive in operation than those hitherto known.

SUMMARY OF THE INVENTION

According to the invention, a duplexer for transmitting and receiving coded telephone pulses including a modulation channel and a demodulation channel connected to a telephone instrument by means of a subscriber line comprises, as switching means for the transmitted and received signals, an electronic semiconductor switch having three pairs of terminals; one terminal pair is connected to the instrument, the two others being connected to the modulation and demodulation channels, respectively.

This feature of our invention eliminates the need for a conventional differential transformer or hybrid coil serving as a coupler. As a result, a duplexer according to the invention is less heavy, less bulky, more reliable and less sensitive in operation than conventional ones. Furthermore, it can be manufactured in the form of integrated circuits.

More particularly, our improved duplexer includes a resistance network connected to the modulation and demodulation channels. In order to provide the necessary conjugacy between the two channels, the modulation channel is connected to a neutral point of the resistance network whose presence reduces the effect of variations in line impedance upon the duplexer. On the other hand, the subscriber line is connected to the resistance network in an unbalanced manner, i.e. unsymmetrically with reference to that neutral point.

The electronic duplexer embodying our invention may comprise four similar inverter-amplifiers. In this case the input to the first amplifier is connected to the output of the third amplifier and the outputs of the first and fourth amplifiers are respectively coupled to the input of the second one by resistors of substantially equal value. The junction of the input of the first and the output of the third amplifier is connected to the transmission line, while the output of the second amplifier is coupled to the modulation channel and the interconnected inputs of the third and fourth amplifiers are connected to the demodulation channel.

Advantageously, each amplifier has an input impedance whose value is close to the impedance of the subscriber line linking it to the telephone instrument and each amplifier includes a single transistor whose base and collector respectively form the input and output thereof. An adjustable resistor may be connected in the input circuit of the first amplifier in order to adjust the potential at the input to the second one. Preferably, this amplifier includes a low-pass RC filter in its input circuit.

In a modification, the electronic duplexer is formed by a transistorized differential circuit with two identical branches whose inputs receive the signal coming from the demodulation channel, the two branches including respective halves of the aforementioned resistance network formed by two identical resistors whose junction is connected to the modulation channel, and line being connected to one of the network halves. Preferably, each branch comprises two transistors of complementary types in tandem. Resistors are provided to adjust the gain of the two branches to the same value.

Alternatively, the electronic coupler is formed by a transistorized differential amplification circuit whose two identical branches each include a transistor controlled by an operational amplifier, the inputs to the two operational amplifiers being connected across the demodulation channel while their outputs are connected through respective network halves to the modulation channel, the line being again connected to one of these network halves.

According to another embodiment of our invention, one of the two operational amplifiers has its inputs connected to the demodulation channel and its output connected to the inverting and noninverting inputs of the second operational amplifier by respective network branches supplying these inputs with cophasal signals of like amplitude, the modulation channel being connected to the output of the second operational amplifier while the line is connected to the resistance network between the operational amplifiers. Such a duplexer thus functions as an active subtractor.

In a further embodiment, the first one of two operational amplifiers has its inputs coupled to the demodulation channel while its output is connected on the one hand to the line and on the other hand across the inputs of the second operational amplifier, the output of this second amplifier being connected to the demodulation channel by two identical network resistors whose junction is coupled to the modulation channel.

In order to make it even easier to produce a device according to the invention in the form of integrated circuits, we prefer to combine the outgoing amplifier and the low-pass modulation filter, as well as the incoming amplifier and the low-pass demodulation filter, into a single operational amplifier forming an active filter. It is thus possible to eliminate the inductances of the filters hitherto used, which also avoids the necessity of adjusting conventional LC filters to compensate for the tolerances in the magnetic circuits and enables the cost and size of the device to be substantially reduced.

These active low-pass filters may exhibit the so-called Rauch or Sallen-Key structure and the so-called Tchebycheff behavior (see, for example, R.P. Sallen and E.L. Key, "A Practical Method of Designing Active Filters," *IRE Transactions — Circuit Theory*, Vol. CT-2, pp. 74 – 85, March 1955). They comprise capacitors, resistors and at least one transistorized differential or operational amplifier. The active filter intended for the modulation channel may be of the second order, while that for the demodulation channel may be of the fifth or sixth order.

In order, on the one hand, to enable the modulator and the demodulator to be combined into a single system and, on the other hand, to enable the modulators and demodulators of a plurality of devices according to the invention to be combined into a single modem (i.e., modulator/demodulator), it is advantageous to interpose between the active modulation and demodulation filters, on the one hand, and the modem, on the other hand, an analog dual change-over gate (with one branch for the modulating channel and another branch for the demodulating channel) which has, however, a single control. Such a gate controls the passage of the signals to be modulated which leave the active modulation filer and are directed toward the modem by means of an omnibus link, as well as the passage of the demodulated signal coming from the modem by an omnibus link and moving in the direction of the active demodulation filter. The analog gate may be constituted either as a field-effect transistor associated with an interface amplifier, or as an extra MOS transistor circuit including the interface amplifier. In both cases the conductive resistance of the analog gate is extremely stable with regard to variations in temperature, in supply voltage and in the amplitude of the signals which pass through it.

In order to reduce the electrical-power consumption in the quiescent state, there is advantageously provided a blocking circuit which, in the absence of a sampling for the electrical signal, cuts off the supply to certain circuits in the device such as change-over gates or active filters.

To this end, these circuits may be fed through power transistors whose conduction is so controlled from demodulation signals by means of a capacitor that, when the telephone signal is not being sampled, the transistors are not allowed to conduct, and vice versa. Thus, the control capacitor can charge to a cut-off voltage when there is no sampling, using, for example, the leakage current of a base/emitter junction of a transistor, while during sampling the said capacitor charges to a triggering voltage. Between the capacitor and the power transistors we may insert a transistorized control circuit.

In order to ensure very high reliability in service by duplication of components, or, indeed, to handle a large amount of telephone traffic by duplicating the lines in the network, there may be interposed between the active modulation and demodulation filters, on the one hand, and the modem, on the other hand, two analog gates. One gate, being associated with the modulation channel, has an input connected to the corresponding active filter and two outputs each connected to an omnibus modulation link leading to the modem; the other gate, being associated with the demodlation channel, has an output connected to the corresponding active filter and two inputs each connected to an omnibus demodulation link coming from the modem.

It will be apparent that, if necessary or found desirable, a plurality of gates may be combined in the same housing, so as to form a self-containing multiplexing unit.

BRIEF DESCRIPTION OF THE DRAWING

In order that the invention may be more clearly understood, reference will now be made to the accompanying drawing in which.

SPECIFIC DESCRIPTION

Figure 1:
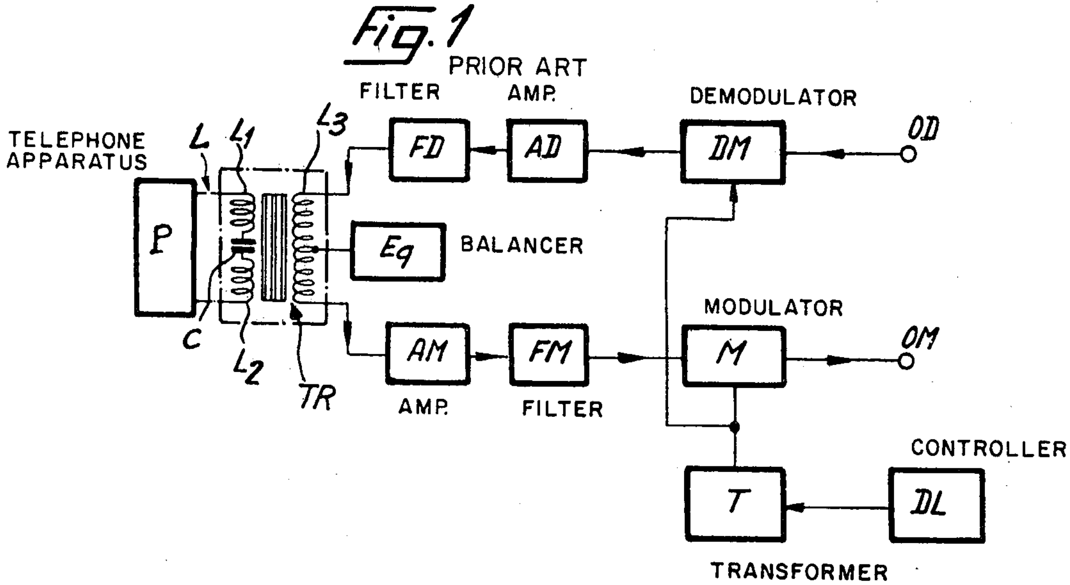
FIG. 1 is a synoptic diagram of a conventional duplexer.

FIG. 1 shows schematically a known telephone transmitter/receiver device or duplexer of the type to which the invention relates and of which it constitutes an improvement.

This device comprises a coupler TR which connects it, via a line L, to a subscriber's instrument P, for example. This coupler, which is known as a hybrid coil and is designed to separate the outgoing signals to be modulated and the incoming demodulated signals, is formed by a transformer in such a way as to adapt the two-wire circuit of the telephone instrument P to the four-wire circuit required for the duplexer so that the reception channel is isolated from the transmission channel. To this end, the coupler TR includes, on the one hand, two identical windings $L_1$ and $L_2$, interconnected by a capacitor C in series therewith, the outer ends of these windings being coupled to the instrument P; on the other hand, it includes a winding L3 having a centertap connected to a balancing load Eq. One end of the winding L3 is connected to a terminal OM via a modulation or outgoing amplifier AM, a modulation filter FM and a modulator M in series, its other end being connected to a terminal OD via a demodulation filter FD, a demodulation or incoming amplifier AD and a demodulator DM. The terminals OM and OD may be connected to transmitting and receiving bus bars, respectively, to which a plurality of devices similar to that of FIG. 1 are connected in parallel.

The modulator M and the demodulator DM, which may be of the diode type for example, are controlled in a known way in synchronization with the pulses to be transmitted and to be received via a transformer T which is itself controlled by a logic device DL associated with the telephone exchange serving the instrument P.

As was mentioned above, the coupler TR is heavy, cumbersome, and sensitive in operation. According to our invention it is replaced, together with its balancer Eq, by an electronic duplexer, one embodiment of which is schematically shown at AG in FIG. 2.

The duplexer AG includes four inverter-amplifiers 1, 2, 3 and 4; the input of amplifier 1 is connected to the output of amplifier 3 while the outputs of amplifiers 1 and 4 are connected to the input of amplifier 2 via equal resistors 5 and 6, respectively. The junction of the input of amplifier 1 with the output of amplifier 3 is coupled to a first terminal 7 connected to the line L. Another line terminal 7′ associated with the terminal 7 is connected to the common ground of the duplexer AG and of the line L.

The output of amplifier 2 is coupled to a second terminal 8 which is connected to the modulation channel AM, FM, M. A terminal 8′ associated with the output terminal 8 is connected to the common ground of the coupler AG and of the modulation channel. Finally, the interconnected inputs of the amplifier 3 and 4 are coupled to a third terminal 9 which is connected to the demodulation channel FD, AD, DM. A terminal 9′ associated with the input terminal 9 is connected to the common ground of the duplexer AG and of the demodulation channel. The connections to amplifier 2 from amplifiers 1 and 4 represent an outgoing-signal path and a balancing-signal path, respectively, whereas the connection between amplifier 3 and terminal 7 constitutes an incoming-signal path.

Such a duplexer operates in the following way:

When a signal to be transmitted arrives across the terminals 7 and 7′ from the instrument P via the line L, this signal is amplified by the amplifier 1, fed into the resistor 5 and further amplified by the amplifier 2. This outgoing signal then appears across the terminals 8 and 8′ which are connected to the modulation channel AM, FM, M. The gain along the path 1, 5, 2 is determined by the magnitude of the gains of the outgoing amplifiers 1 and 2 and by the value of the resistors 5 and 6.

When the demodulated signal arrives across the terminals 9 and 9′ from the demodulation channel DM, AD, FD, this signal is amplified both by the amplidifer 3 and by the amplifier 4. There thus appears an amplified incoming signal across the terminals 7, 7′ and at the resistor 6. At the same time, the signal at terminals 7 and 7′ is amplified by the amplifier 1 and fed into the resistor 5. By adjusting the gains of amplifiers 1, 3 and 4, the amplitudes of the incoming and balancing signals at the terminals of resistors 5 and 6 can be made equal. Since these signals are in phase opposition as a result of the way the amplifiers are connected, they cancel each other whereby the junction of resistors 5 and 6 is a neutral point so that the resulting signal at the input to amplifier 2 will be zero. In this case, no signal appears across the terminals 8 and 8′ which are thus conjugate with terminals 9 and 9′.

Figure 2:
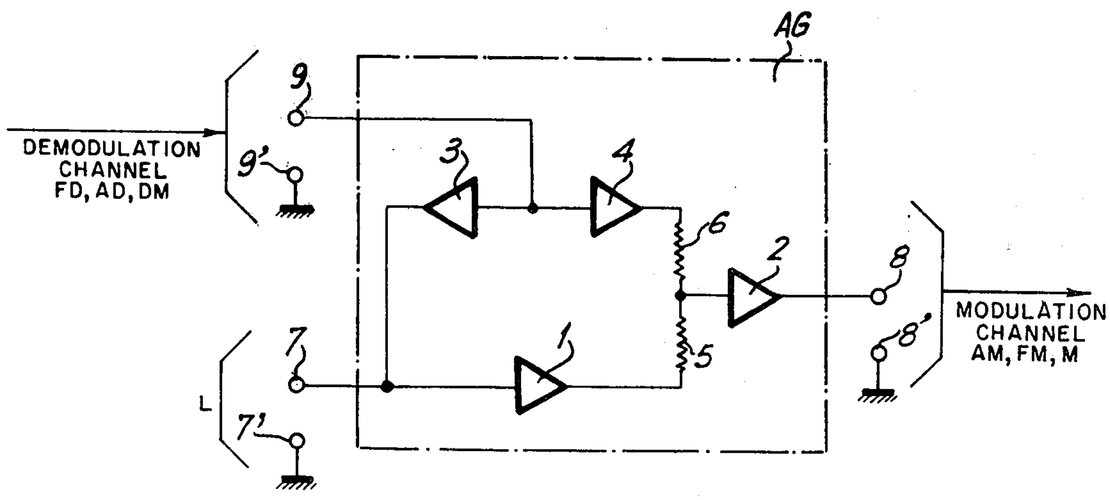
FIG. 2 is a synoptic diagram of an electronic duplexer according to our invention.
Figure 3:
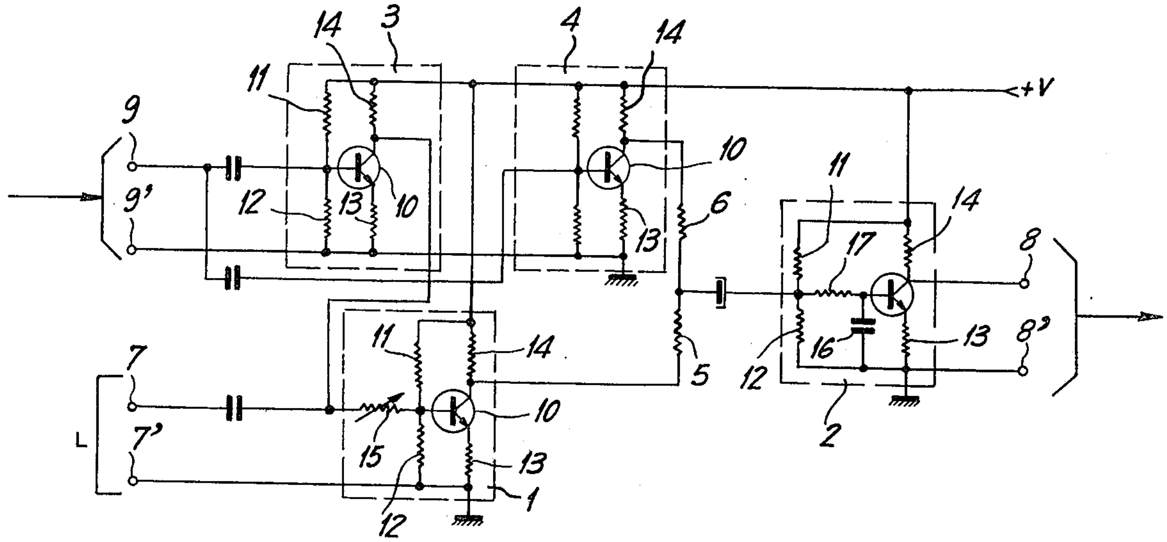
FIG. 3 shows an actual circuit diagram of an embodiment of the duplexer of FIG. 2.

FIG. 3 shows a practical embodiment of the duplexer AG shown schematically in FIG. 2. In this example, each inverter-amplifier is formed by a single transistor 10, of the NPN type for example, the base and the collector of which serve as an input and output thereof. In this embodiment, the base of the transistor 10 is biased by the positive terminal +V of a d-c voltage source and a pair of resistors 11 and 12 connected across this source, its emitter being connected through a resistor 13 to the negative terminal (ground) of this source and its collector being biased by a resistor 14 which is connected to the positive terminal. A variable resistor 15 at the input of amplifier 1 enables the potential variations at the junction of resistors 5 and 6 to be exactly balanced out; a low-pass RC filter 16 – 17 is provided in the input circuit of amplifier 2. The input impedance of the amplifiers 1, 2, 3, 4 is equal in value to the impedance of the line L (600 Ω for example).

Figure 4:
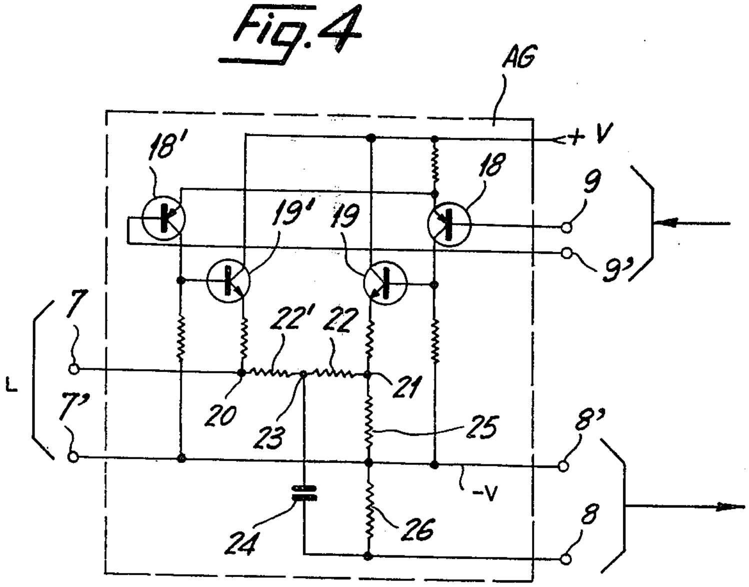
FIGS. 4, 5, 6 and 7 show modified electronic duplexers embodying our invention.

FIG. 4 shows another duplexer AG comprising a transistorized differential amplification circuit with two identical branches. Each branch is constituted by two transistors 18, 18′ and 19, 19′ of complementary type, in tandem. The inputs of these branches are respectively connected to the terminals 9 and 9′. Points 20 and 21 in the output circuits of the second-stage transistors 19', 19 of the two branches are interconnected by two equal resistors 22, 22'. The output point 20 of the left-hand branch, whose input is connected to the terminal 9', is connected to the terminal 7 while the neutral point 23 at the junction of the resistors 22, 22' is coupled to the terminal 8 by a capacitor 24; the terminals 7' and 8' are connected to the negative pole −V of the d-c power supply.

The output point 21 of the right-hand branch is connected to this negative pole by a resistor 25, another resistor 26 being provided between this pole and the terminal 8.

Such a system operates in the following way. When a signal to be transmitted arrives across the terminals 7 and 7' from the instrument P of FIG. 1 via the line L, it undergoes slight attenuation due to the resistors 22, 22', 25 and 26 and is developed via capacitor 24 across the terminals 8 and 8' which are connected to the modulation channel AM, FM, M, the demodulation channel connected to the terminals 9 and 9' receiving no signal since the signal to be transmitted is present only at the outputs of the differential amplification circuit.

Conversely, when a demodulated signal appears across the terminals 9 and 9' from the demodulation channel DM, AD, FD, this signal is amplified by the two branch paths each supplying its output signal to the respective resistor 22, 22'; these two output signals are in phase opposition. As a result, a signal appears across the terminals 7 and 7' which are connected to the line L, while the potential variation at point 23 is zero and no signal is developed across terminals 8 and 8'. To achieve this result it is vital that the gains in the two circuit branches be identical and that the two resistors 22, 22' be equal. The resistor 25 enables the gains in the two branches to be suitably selected while the resistor 26 serves as a load for capacitor 24. When there is no sampling signal, the demodulation filter shown at FD in FIG. 1 may be so designed (see FIG. 9) as to supply a voltage to the terminals 9 and 9' of the duplexer which causes the transistors 18, 18' to cut off the transistors 19, 19', thus limiting the current consumption in the circuit.

Figure 5:
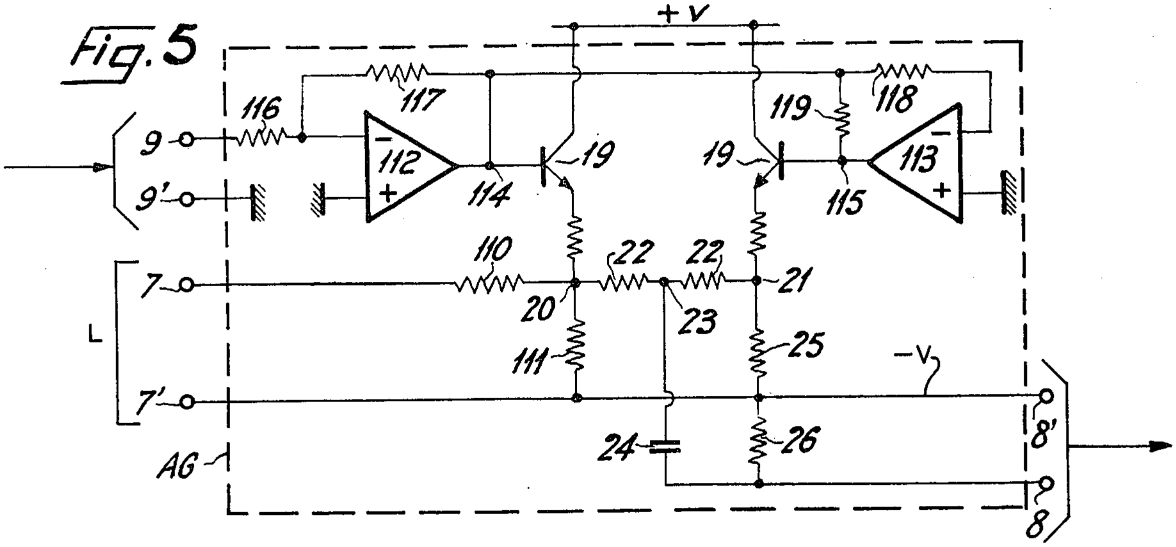

The duplexer AG shown in FIG. 5 is comparable with the one shown in FIG. 4. Similar components in the two Figures bear identical reference numbers. The duplexer AG in FIG. 5 comprises a differential amplification circuit employing two transistors 19, 19' of NPN type, the collectors of which are connected to a point of +V potential and the emitters of which are connected, by a resistive path, to points 20 and 21, respectively, between which two identical resistors 22, 22' are connected in series. Point 20 is connected to the terminal 7 by a resistor 110 and to the terminals 7' and 8' by a resistor 111, these terminal being supplied by the negative pole −V of the d-c supply. Point 21 is connected to the terminals 7' and 8' by the resistor 25 while the terminal 8 is coupled, on the one hand, to the terminals 7' and 8' by the resistor 26 and, on the other hand, to the junction point 23, which is common to the resistors 22 and 22', by capacitor 24.

The duplexer further includes two operational amplifiers 112 and 113, the outputs of which are connected to the bases 114 and 115 respectively of the transistors 19', 19 which form part of the two branches of the differential amplification circuit.

The inverting input of the operational amplifier 112 is connected to the terminal 9 by a resistor 116 and to the corresponding input of the operational amplifier 113 by two resistors 117 and 118 in series, the resistor 117 being connected directly in parallel with the amplifier 112 while the resistor 118 is connected in parallel with the amplifier 113 via a resistor 119. The terminal 9' and the noninverting inputs of the amplifiers 112 and 113 are connected to ground. Resistors 116 – 118 constitute a voltage divider.

The resistors 116 and 118 are selected so that the signals at the bases 114 and 115 of the transistors 19' and 19 are of the same amplitude but are in phase opposition. This switch AG functions as a subtractor.

When a signal to be transmitted appears across the terminals 7 and 7' from the instrument P via the line L, this signal undergoes slight attenuation from the resistors 22, 22', 25, 26, 110 and 111 and then appears between the terminals 8 and 8' which are connected to the modulation channel AM, FM, M; the demodulation channel connected to the terminals 9 and 9' does not receive a signal since the terminals 7 and 7' are effectively isolated from the terminals 9 and 9'.

Conversely, when a demodulated signal appears across the terminals 9 and 9' from the modulation channel DM, AD, F, this signal is amplified by the two branches of the differential circuit, each of these branches applying its output signal to the corresponding resistor 22 or 22'; these two signals are again in phase opposition. As a result, a signal appears across the terminals 7 and 7' which are connected to the line L, while the potential variation at point 23 is zero and no signal is developed across the terminals 8 and 8'. To achieve this result it is clearly necessary that the gains in the two branches of the differential amplification circuit be identical and the two resistors 22, 22' be equal in value. The resistor network located between the points 20, 21 and 23 enables the symmetry of the subtractor to be preserved when the line impedance encountered between the terminals 7 and 7' varies, the resistors 110 and 111 serving to reduce the effects of these impedance variations.

Figure 6:
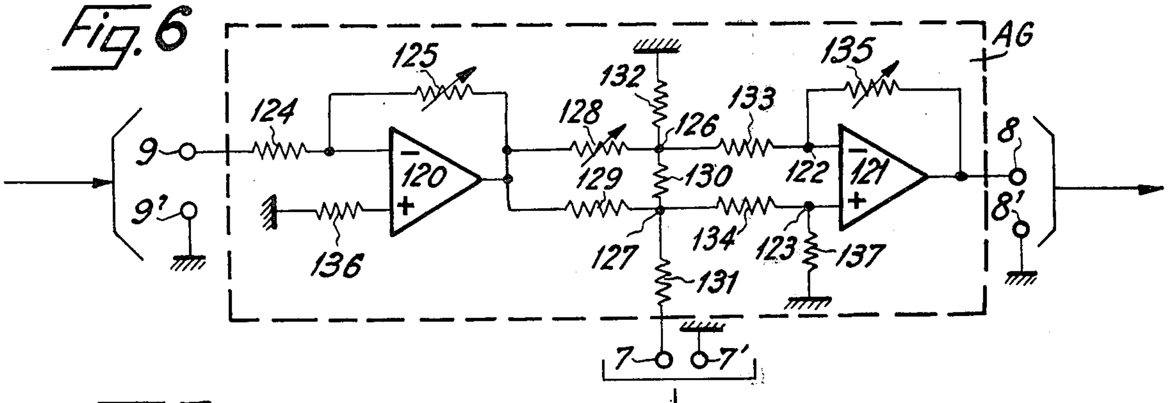

The modified coupler AG shown in FIG. 6 includes two operational amplifiers 120 and 121 forming an active subtractor. In operation, this subtractor uses the common-mode rejection of the operational amplifier 121, which presupposes that the signals received at the inputs 122 and 123 of the latter are of the same amplitude and are in phase.

The terminal 9 is connected to the inverting input of the operational amplifier 120 by a resistor 124, the amplifier being bridged between its inverting input and its output by a variable resistor 125. Thus, the transmission gain in the operational amplifier 120 is determined by the values of the resistors 124 and 125. The output of this operational amplifier is connected to two points 126 and 127 via resistors 128 and 129, respectively, these points being separated by a resistor 130. The terminal 7 is coupled to the point 127 by a resistor 131, while the point 126 is connected to ground by a resistor 132. The inverting input 122 of the operational amplifier 121 is connected to the point 126 by a resistor 133, while the noninverting input 123 of that amplifier is coupled to the point 127 by a resistor 134. The output of the amplifier 121, serving as the neutral point, is connected to the terminal 8 and a variable resistor 135 is connected between the input 122 and the latter output. The noninverting inputs of the operational amplifiers 120 and 121 are connected to ground by resistors 136 and 137, respectively, while the terminals 7′, 8′ and 9′ are directly grounded.

When a signal to be transmitted appears across the terminals 7 and 7′, from the instrument P via the line L, this signal undergoes a slight attenuation from the resistors 128, 129, 130, 131, 133 and 134 but is again amplified by the operational amplifier 121, whose gain is determined by the resistors 133 and 135, across the terminals 8 and 8′ which are connected to the modulation channel AM, FM, M. The demodulation channel connected to the terminals 9 and 9′ does not receive a signal since the signal to be transmitted is present only at the output of the operational amplifier 120.

Conversely, when a demodulated signal appears across the terminals 9 and 9′ from the demodulation channel DM, AD, FD, this signal is amplified by the operational amplifier 120 and reappears at the terminals 122 and 123. The signals at the terminals 122 and 123 being equal and in phase, no signal is developed across terminals 8 and 8′. On the other hand, a signal appears between the terminals 7 and 7′ which are connected to the line L. In the embodiment shown in FIG. 6, the various adjustments may be more independent than in the foregoing embodiment. Furthermore, the number of active components uses is smaller. The resistor 125 is used to adjust the transfer gain between the terminals 9, 9′ and 7, 7′. The variable resistor 128 enables the subtractor to be balanced so that the signals at 122 and 123 are equal. The variable resistance 135 is used to adjust the transfer gain between the terminals 7, 7′ and 8, 8′.

Figure 7:
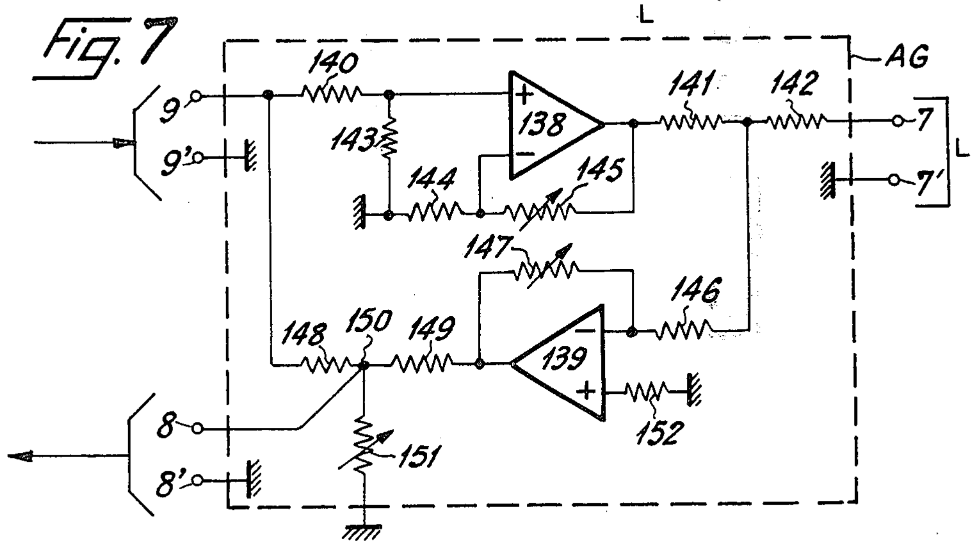

The duplexer AG shown in FIG. 7 also includes two operational amplifiers 138 and 139. This modification includes a passive subtractor somewhat analogous to the embodiment shown in FIG. 2.

The noninverting input of the operational amplifier 138 is connected to the terminal 9 by a resistor 140, while the output of this amplifier is connected to the terminal 7 via resistors 141 and 142 in series. Furthermore, the noninverting and inverting inputs of the operational amplifier 138 are interconnected by two resistors 143 and 144 in series, the junction of these resistors being connected to ground. The operational amplifier 138 is shunted between its inverting input and its output by a variable resistor 145.

The inverting input of the operational amplifier 139 is connected by a resistor 146 to the junction of the resistors 141 and 142 and by a variable resistor 147 to the output of the same amplifier. This output is also connected to the terminal 9 by two resistors 148 and 149 in series, the neutral point 150 at the junction of these two resistors being coupled, on the one hand, to the terminal 8 and, on the other hand, to ground by a variable resistor 151. The noninverting input to the operational amplifier 139 is connected to ground by a resistor 152.

When a signal to be transmitted appears across the terminals 7 and 7′ from the instrument P (see FIG. 1) via the line L, this signal is amplified by the amplifier 139 and fed into the resistor 149 before appearing across the terminals 8 and 8′ which are connected to the modulation channel AM, FM, M. The gain in the conductive path between the terminals 7, 7′ and 8, 8′ is determined by the resistors 141, 142, 146, 147, 148, 149, 151 and by the operational amplifier 139.

When a demodulated signal appears across the terminals 9 and 9′ from the demodulation channel DM, AD, FD, this signal as amplified by the operational amplifier 138 appears across the terminals 7 and 7′ as well as at the inverting input of the operational amplifier 139. As a result an amplified signal also appears at the junction 150 of resistor 149 with resistor 148 which is energized directly from the terminal 9. Since the various components in the circuit are such that the signals at the resistors 148 and 149 are of the same amplitude but of opposite phase, the resultant signal at point 150, and thus across the terminals 8 and 8′, is zero.

The resistors 141 and 142 enable the influences of variations of impedance in the line L connected to the terminals 7, 7′ to be greatly reduced. The resistor 145 enables the gain between the terminals 9, 9′ and 7, 7′ to be adjusted. The resistor 147 enables the amplitude of the signal applied to the resistor 149 to be adjusted, while the resistor 151 enables the gain between the terminals 7, 7′ and 8, 8′ to be adjusted.

As was mentioned above, it is advantageous to combine the modulation filter and amplifier into a single active filter and to do the same with the demodulation filter and amplifier.

Figure 8:
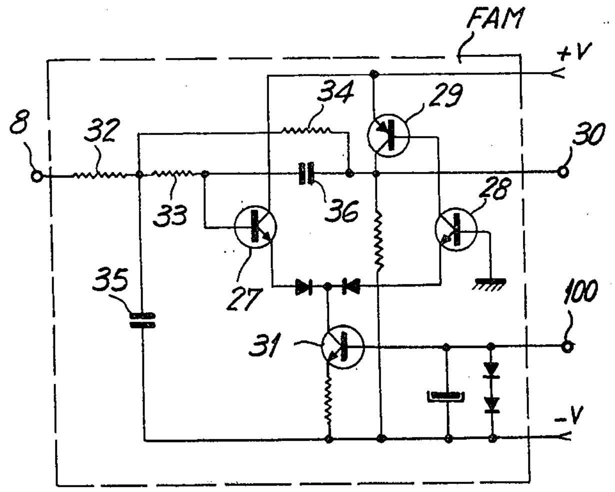
FIG. 8 shows an active modulation filter.

FIG. 8 shows such an active modulation filter FAM of the aforementioned Rauch structure with so-called Tchebycheff behavior, this filter acting as a signal inverter and having a resistive feedback path 34. It is of interest, besides the fact that it comprises only resistors, capacitors, diodes and transistors, in that its stability depends only on the resistors and capacitors, since the amplifier has total feedback. This low-pass filter FAM, replacing the components AM and FM of the modulating channel of FIG. 1, is of the second order.

The filter FAM includes a differential stage comprising two NPN transistors 27 and 28, the base of the transistor 28 being connected to a point of fixed potential, the supply ground for example. A PNP transistor 29, whose collector is connected to an output terminal 30, enables the gain to be increased without phase inversion. An NPN transistor 31 mounted in the output circuit of the differential amplifier 27 – 28 serves as a constant-current source to supply the latter. The base of the transistor 31, which is connected to a control terminal 100, receives an electrical blocking signal of voltage −V when there is no sampling. The transistor 31 is then cut off and the amplification circuit of the active filter is no longer fed with current, which results in a reduction of the power consumed. When there is a sampling pulse, the terminal 100 receives a DC voltage higher than the base/emitter threshold of the transistor 31 which then functions as a current generator. Resistors 32, 33 and 34 and capacitors 35 and 36 determine the characteristics of the filter. The base of the transistor 27 is connected to the coupler AG by the terminal 8 via resistors 32 and 33.

Figure 9:
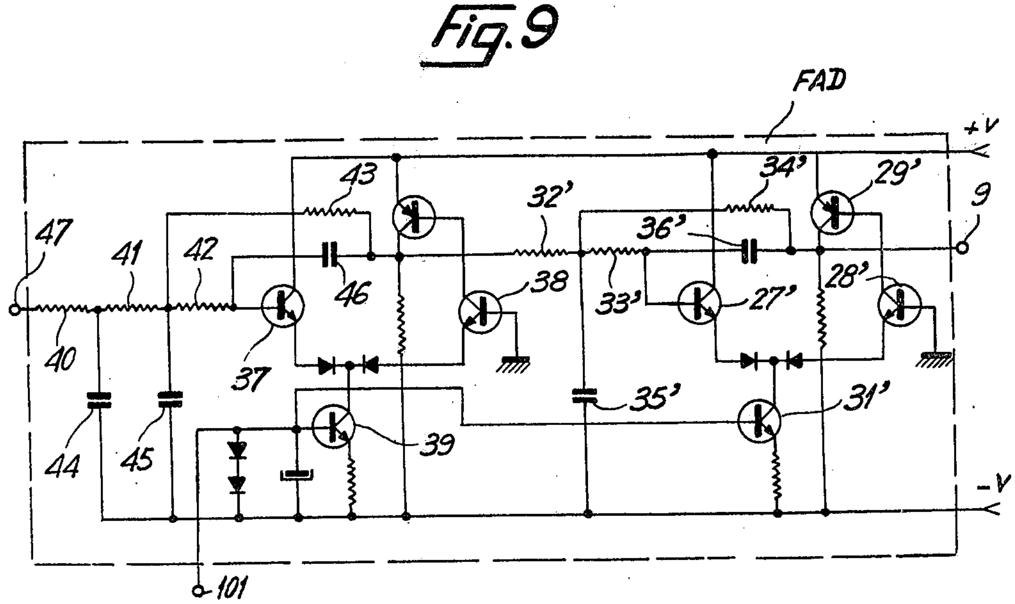
FIG. 9 shows an active demodulation filter.

FIG. 9 shows an active filter FAD replacing the components FD and AD in the demodulating channel of FIG. 1. This filter is of the fifth order and is formed by combining a second-order filter (similar to the filter FAM), whose components bear the same reference numerals as in FIG. 8 with the addition of a prime mark, and a third-order filter also provided with a differential amplifier 37, 38 and a constant-current generator 39. The bases of the transistors 39 and 31′, which are connected to a terminal 101, receive an electrical blocking signal of DC voltage −V when there is no sampling. The transistors 39 and 31′ are then cut off and the amplifiers of the filters are no longer supplied with current, resulting in a reduction in the power consumption. When there is a sampling pulse, the terminal 101 receives a DC voltage higher than the base/emitter threshold of transistors 31′ and 39 which then perform their function of current generators. The terminals 101 of FIG. 9 and 100 of FIG. 8 may be interconnected. As before, resistors 32′, 33′ 34′ and capacitors 35′ and 36′ determine the characteristics of the second-order filter. Resistors 40, 41, 42 and 43 and capacitors 44, 45 and 46 determine the characteristics of the third-order filter. The base of the transistor 37 is connected, through resistors 40, 41 and 42, to the input terminal 47, while the base of the transistor 27′ is coupled to duplexer AG by the terminal 9 via the capacitor 36′.

Figure 10:
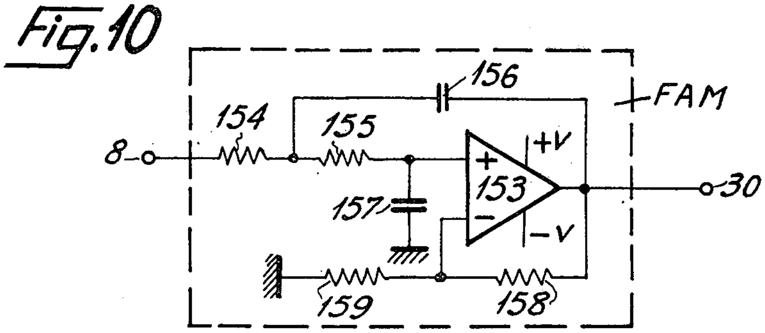
FIG. 10 shows a modified active modulation filter.

FIG. 10 illustrates a modification of the active modulation filter FAM shown in FIG. 8. This modification is of the so-called Sallen-Key type mentioned above and forms a second-order low-pass filter with so-called Tchebycheff behavior, acting without signal inversion and having a capacitive feedback path 156.

This filter includes an operational amplifier 153 whose noninverting input is connected to the terminal 8 by resistors 154 and 155 in series and whose output is connected to the terminal 30. The capacitor 156 is mounted between the junction of the resistors 154 and 155 and the output of the operational amplifier 153. Furthermore, the noninverting input of the latter is coupled to ground by another capacitor 157. The inverting input of differential amplifier 153 is connected, on the one hand, to the output of the latter by a resistor 158 and, on the other hand, to ground by a resistor 159. The resistors 154, 155, 158 and 159 as well as the capacitors 156 and 157 determine the characteristics of the filter.

The operational amplifier 153 is supplied by voltages =V and −V. When there are no sampling pulses for the telephone signal, the voltages +V and −V are cut off. They only come back on with the sampling pulses.

Figure 11:
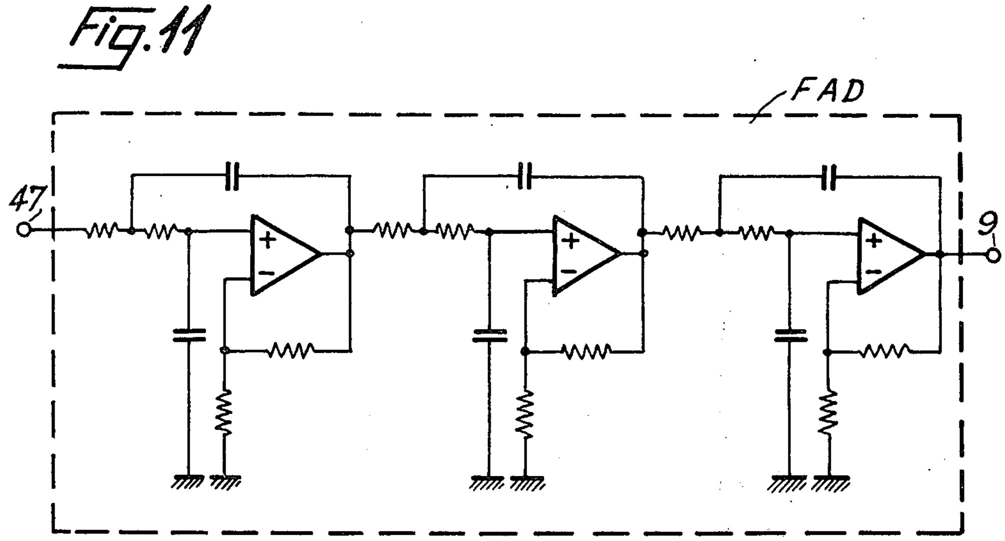
FIG. 11 shows a modified active demodulation filter.

FIG. 11 shows a modification of the active demodulation filter FAD illustrated in FIG. 9. This modified filter FAD is made up by mounting three filter sections of identical construction, corresponding to that of the filter FAM in FIG. 10, in cascade. It is is of the sixth order and conforms to the so-called Tchebycheff behavior. When there are no voice-signal sampling pulses, the supply voltages to the operational amplifiers are cut off to reduce the power consumption.

Figure 12:
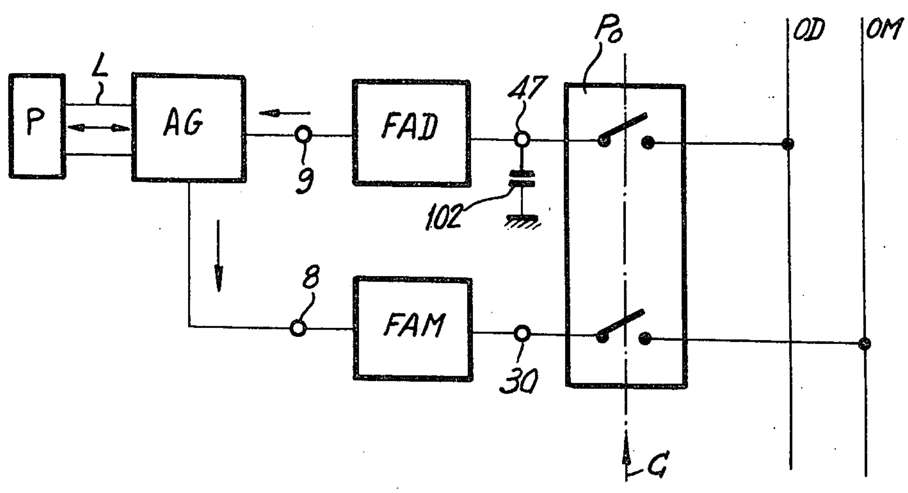
FIG. 12 is a synoptic diagram of a device according to our invention.

In order to be able to combine the modulators and the demodulators into a single modem, there is interposed (see FIG. 12) between the terminals 30 and 47 of the active filters FAM and FAD, on the one hand, and the modem, on the other hand, an analog gate $P_O$ with two branches, one of which connects the terminal 30 to a modulation bus bar OM, the other branch linking the terminal 147 to a demodulation bus bar OD. This analog gate $P_O$ which includes a single input C for the conductive state of both branches, may be constituted by supplementary MOS circuitry or by at least one field-effect transistor. At the input of the active demodulation filter FAD, a capacitor 102 is tied to a point 47. This capacitor 102 performs a storage function with stepwise intergration of the amplitude-modulated pulses supplied by the analog gate connected to the demodulation bus bar OD.

Figure 13:
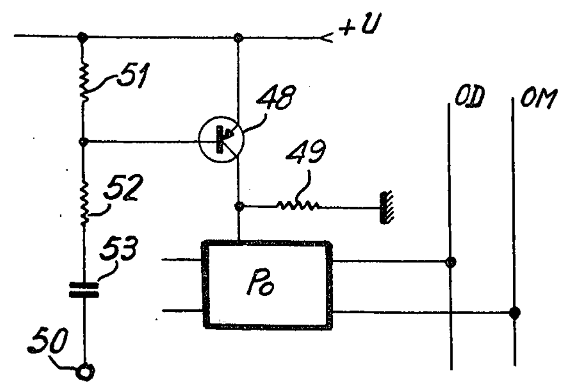
FIG. 13 shows a supply-cut-off circuit for an analog gate shown in FIG. 12.

As FIG. 13 shows, it is useful to add to the gate $P_O$ a transistor switching stage to reduce its power consumption when the system is at rest. To this end, the gate input is energizable from a d-c power source through the emitter/collector path of a transistor 48, here of the PNP type, which is normally cut off in the quiescent state. A resistor 49 enables the gate $P_O$ to be brought to ground potential. Between the positive pole +U of the power supply and a terminal 50 are arranged two resistors 51 and 52 and a capacitor 53 in series, the junction of the resistors 51 and 52 being connected to the base of the transistor 48. The terminal 50 is normally maintained at a potential equal to +U. The transistor 48 is then cut off as well as the supply to the gate $P_O$. Conversely, when a pulse going to zero potential appears at the terminal 50, a current flows across the capacitor 53 and the transistor 48 conducts, which enables power to be supplied to the analog gate $P_O$. The resistors 49, 51 and 52 are designed to saturate the transistor so that its internal resistance is very low. At the end of the pulse, when the potential at the terminal 50 returns to +U, the capacitor 53 charges, which has the effect of again cutting off the transistor 48 and the supply to the gate $P_0$.

Figure 14:
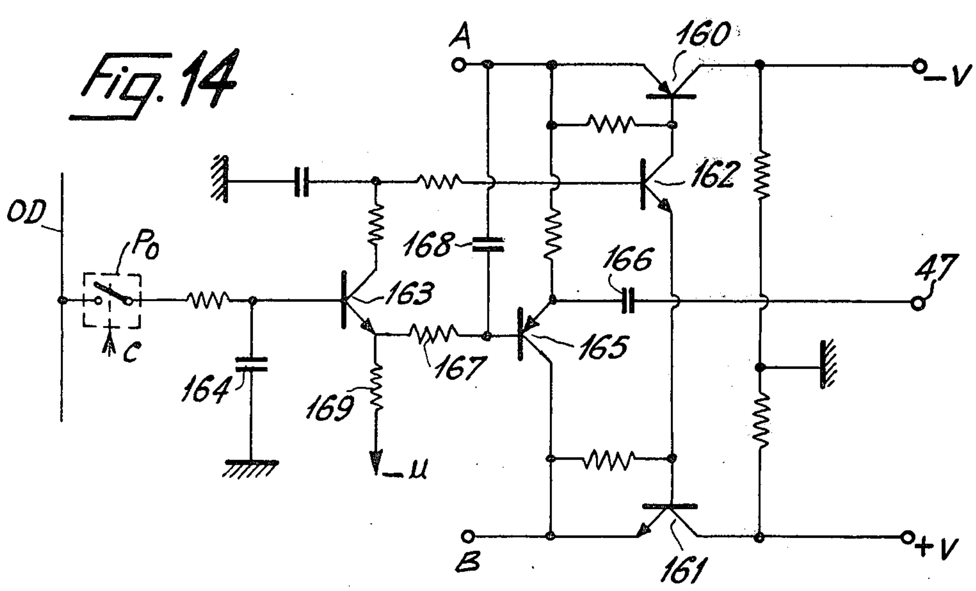
FIG. 14 shows a supply breaker for a device according to our invention.

FIG. 14 shows a modified network which may be provided to reduce the electrical consumption of the device when there is no sampling. This network is connected on one side to the demodulation bus bar OD via a gate $P_O$ with a control C and on the other side to the terminal 47 of the filter FAD. The network enables the supply to at least certain circuits to be turned on and off by controlling the conduction of two complementary transistors 160 and 161 whose emitter/collector paths are respectively connected in series with the poles −V and +V of a power source. The bases of the transistors 160 and 161 are interconnected via the emitter/collector path of a transistor 162 whose base is connected to the emitter/collector path of another transistor 163. The base of this transistor 163 is connected, on the one hand, to the gate $P_O$ and, on the other hand, to ground by a capacitor 164 forming part of a time-constant network. With the transistor 163 is associated another transistor 165 whose emitter is connected to the terminal 47 by a capacitor 166. The transistors 163 and 165 are mounted in the so-called "complementary emitter-follower" arrangement. Between the emitter of the transmitter 163 and the base of the transistor 165 is inserted a low-pass filter 167, 168 of the RC type. The emitter of the transistor 163 is connected to a point at potential -u by a resistor 169. The operation of this device is as follows.

Upon prolonged absence of a sampling order for the voice signal, the gate $P_O$ is open. As a result, the capacitor 164 charges to potential -u through the resistor 169, via the leakage (i.e., reverse) current of the base/emitter junction of the transistor 163, cutting off the latter transistor. This blocks the flow of base current from transistors 160 and 161 through the emitter and collector circuit of the transistor 162 which cuts off the transistors 160 and 161 and therefore interrupts the supply from the source +V, −V. At the same time, transistor 165 is turned on to place a shunt across load terminals A, B.

When there is a sampling order (voltage at OD), the gate $P_O$ closes on account of the control C. The positive voltage on bus bar OD is transmitted to the capacitor 164 and to the base of the transistor 163, thereby blocking the transistor 164. The value of biasing voltage -u is so chosen that the transistors 162, 160 and 161 are now once more conducting. When the gate $P_O$ again opens, the capacitor 164 remains positively charged from the voltage of the bus bar OD for a certain length of time. However, as stated above, at the end of that period the leakage current at the base/emitter junction of the transistor 163 dissipates the stored positive charge and the capacitor is then negatively charged. The transistors 163, 162, 160 and 161 are thereupon again cut off.

Figure 15:
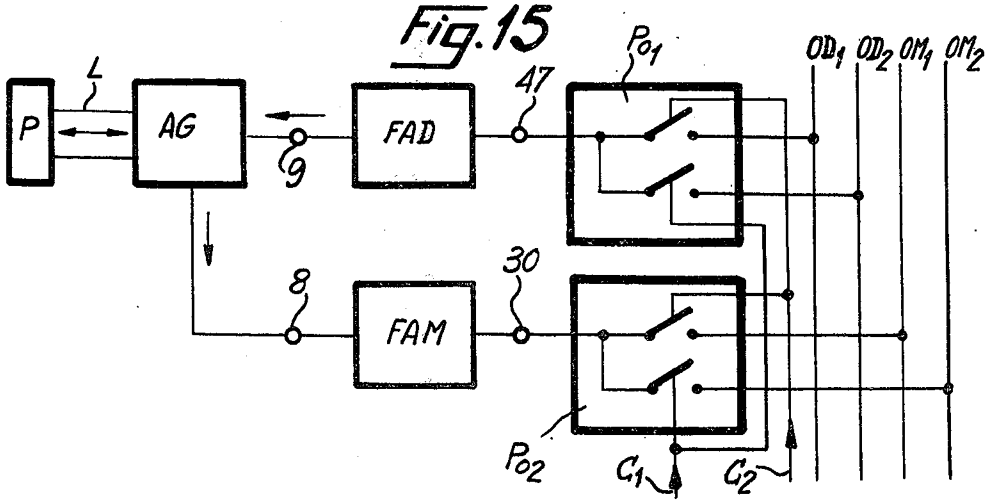
FIG. 15 is a synoptic diagram of a modification of the device shown in FIG. 12.

As shown in FIG. 15, the bus bars extending to the modem may be split into two pairs by providing two analog gates $P_{01}$ and $P_{02}$ which are also constituted by supplemental MOS circuitry or by at least one field-effect transistor. The analog gate $P_{01}$ has two inputs each of which is connected to a demodulation bus bar $OD_1$ or $OD_2$ conveying the modulated signals from the modem, and an output connected to the terminal 47. The analog gate $P_{02}$ has an input connected to the terminal 30 and two outputs each of which is connected to a bus bar $OM_1$ or $OM_2$ conveying the signals to be modulated to the modem.

A first control $C_1$ allows synchronous switching of one branch of the gate $P_{01}$ and one branch of the gate $P_{02}$ while a second control $C_2$ allows synchronous switching of the other branch of the gate $P_{01}$ and the other branch of the gate $P_{02}$.

A duplexer according to the invention may be composed of a first integrated circuit combining the semiconductor switch and two active filters, for modulation and demodulation respectively, and of a second integrated circuit including the analog gates.

We claim:

1. In a PCM telecommunication system, in combination;

a subscriber line provided with a first terminal;

a modulation channel for signals originating at said subscriber line, said modulation channel being provided with a second terminal;

a demodulation channel for signals to be transmitted to said subscriber line, said demodulation channel being provided with a third terminal;

duplexing means for coupling said channels to said subscriber line while decoupling said channels from each other, said duplexing means comprising a resistance network forming an incoming-signal path from said third terminal to said first terminal, an outgoing-signal path from said first terminal to said second terminal, and a balancing-signal path from said third terminal to said second terminal for cancelling the transmission of signals from said demodulation channel to said modulation channel via said incoming-signal and outgoing-signal paths in series; and signal-amplifying means including at least one amplifier inserted between said third terminal and said network for preventing the transmission of signals from said first terminal to said third terminal via said incoming-signal path.

2. The combination defined in claim 1 wherein said signal-amplifying means comprises a first amplifier with an input connected to said third terminal and an output connected to said incoming-signal path, and a second amplifier with an input connected to said first terminal and an output connected to said outgoing-signal path.

3. The combination defined in claim 2 wherein said first amplifier is an operational amplifier with a noninverting input connected to said third terminal, said second amplifier being an operational amplifier with an inverting input connected to said first terminal.

4. The combination defined in claim 2 wherein said resistance network comprises a pair of identical resistors in said outgoing-signal path and in said balancing-signal path, said resistors forming a junction point connected to said second terminal.

5. The combination defined in claim 4 wherein said signal-amplifying means further comprises a third amplifier having an input connected in parallel with that of said first amplifier to said third terminal, said third amplifier having an output connected to said balancing-signal path.

6. The combination defined in claim 5 wherein said amplifiers are individual transistors.

7. The combination defined in claim 5, further comprising a fourth amplifier inserted between said junction point and said terminal, said fourth amplifier having an input circuit including a low-pass resistive-capacitive filter.

8. The combination defined in claim 1 wherein said signal-amplifying means comprises a differential amplification circuit with two identical halves having inputs connected to said third terminal and outputs respectively connected to said incoming-signal path and to said balancing-signal path.

9. The combination defined in claim 8 wherein each of said halves comprises two complementary transistors connected in tandem.

10. The combination defined in claim 8 wherein said halves comprise a pair of operational amplifiers with inverting inputs and a resistive voltage divider connecting said inverting inputs to said third terminal.

11. The combination defined in claim 10 wherein each of said halves further comprises a transistor inserted between said resistance network and the respective operational amplifier.

12. The combination defined in claim 1 wherein said signal-amplifying means includes an operational amplifier having two relatively inverting inputs respectively connected to said incoming-signal path and to said balancing-signal path for cophasal energization by a signal in said demodulation channel, said operational amplifier having an output connected to said second terminal.

13. The combination defined in claim 12 wherein said signal-amplifying means comprises another operational amplifier inserted between said third terminal and said incoming-signal and balancing-signal paths.

14. The combination defined in claim 1 wherein said modulation channel comprises an outgoing amplifier, a first low-pass filter and a modulator in series, said demodulation channel comprising a demodulator, an incoming amplifier and a second low-pass filter in series.

15. The combination defined in claim 14 wherein said outgoing amplifier and said first low-pass filter form part of a first active filter, said incoming amplifier and said second low-pass filter forming part of a second active filter.

16. The combination defined in claim 15 wherein said second active filter includes a substantial replica of said first active filter.

17. The combination defined in claim 15 wherein at least one of said active filters has an inverting characteristic and a resistive feedback path.

18. The combination defined in claim 15 wherein at least one of said active filters has a noninverting characteristic and a capacitive feedback path.

19. The combination defined in claim 14 wherein said channels are provided with supply circuits for the amplifiers thereof and with blocking means in said supply circuits responsive to the absence of signals on said channels for deactivating said amplifiers.

20. The combination defined in claim 19 wherein the amplifier of each filter includes a pair of differentially connected transistors, said blocking means comprising a further transistor in series with both said differentially connected transistors.

21. The combination defined in claim 19 wherein said demodulation channel is provided with a time-constant network connected to said blocking means for deactivating said incoming amplifier upon prolonged absence of signals from said demodulator.

22. The combination defined in claim 21 wherein said time-constant network comprises a capacitor and a transistor having a base and an emitter connected with reverse resistance between said capacitor and a source of charging potential therefor.

23. In a PCM telecommunication system, in combination:

a subscriber line provided with a first terminal;

a modulation channel for signals originating at said subscriber line, said modulation channel being provided with a second terminal;

a demodulation channel for signals to be transmitted to said subscriber line, said demodulation channel being provided with a third terminal;

duplexing means for coupling said channels to said subscriber line while decoupling said channels from each other, said duplexing means comprising an incoming-signal path from said third terminal to said first terminal, an outgoing-signal path from said first terminal to said second terminal, a balancing-signal path from said third terminal to said second terminal, and a resistance network including at least one resistor inserted in said balancing-signal path for canceling the transmission of signals from said demodulation channel to said modulation channel via said incoming-signal and outgoing-signal paths in series; and signal-amplifying means including at least one amplifier inserted between said third terminal and said first terminal for preventing the transmission of signals from said first terminal to said third terminal via said incoming-signal path.

* * * * *